(12) United States Patent
Nitsche et al.

(10) Patent No.: US 7,498,888 B2
(45) Date of Patent: Mar. 3, 2009

(54) METHOD AND ARRANGEMENT FOR INTERFERENCE COMPENSATION IN A VOLTAGE-CONTROLLED FREQUENCY GENERATOR

(75) Inventors: Gunnar Nitsche, Radebeul (DE); Volker Aue, Dresden (DE); Andreas Bury, Dresden (DE)

(73) Assignee: NXP B.V., Eindhoven (NL)

( * ) Notice: Subject to any disclaimer, the term of this patent is extended or adjusted under 35 U.S.C. 154(b) by 321 days.

(21) Appl. No.: 10/596,454

(22) PCT Filed: Dec. 10, 2004

(86) PCT No.: PCT/IB2004/052756

§ 371 (c)(1),
(2), (4) Date: Jun. 14, 2006

(87) PCT Pub. No.: WO2005/062471

PCT Pub. Date: Jul. 7, 2005

(65) Prior Publication Data

US 2007/0194811 A1      Aug. 23, 2007

(30) Foreign Application Priority Data

Dec. 19, 2003    (EP) .................................. 03104837

(51) Int. Cl.
*H03L 7/093*    (2006.01)
(52) U.S. Cl. ........................ 331/17; 331/179; 327/157
(58) Field of Classification Search ................ 331/17, 331/179; 327/157
See application file for complete search history.

(56) References Cited

U.S. PATENT DOCUMENTS 7,203,149 B1 *    4/2007    Sano ........................ 369/59.11
7,420,428 B2 *    9/2008    Pera et al. ................... 331/17

FOREIGN PATENT DOCUMENTS

EP            0360442 A1 *    3/1990

* cited by examiner

*Primary Examiner*—Robert Pascal
*Assistant Examiner*—James E Goodley

(57) ABSTRACT

The invention, which relates to a method and an arrangement for interference compensation in a phase-locked loop comprising a voltage-controlled frequency generator, wherein the frequency generator is tuned to a nominal frequency by a tuning voltage $V_{tune}$ and whose actual frequency is compared with a reference frequency by means of a frequency comparison and is re-adjusted if a deviation is detected via the frequency comparison, in which case, in the event of interference, the tuning voltage $V_{tune}$ is changed by an interference voltage $V_{stör}$ that depends on the interference event, and thus a frequency deviating from the nominal frequency is generated, which deviating frequency is corrected again by the phase locked loop, is based on the object to provide a method and an arrangement for interference compensation in a phase-locked loop comprising a voltage-controlled frequency generator, with which a deviation from a predefined nominal frequency is avoided if known interference events occur. The object is achieved in accordance with the invention in a method whereby, if a known interference event occurs, a voltage $V_{stör}$ which compensates for the interference voltage $V_{comp}$, is generated in synchronism with this with sign inversion and is superimposed on the interference voltage $V_{stör}$.

6 Claims, 6 Drawing Sheets

Figure 1:
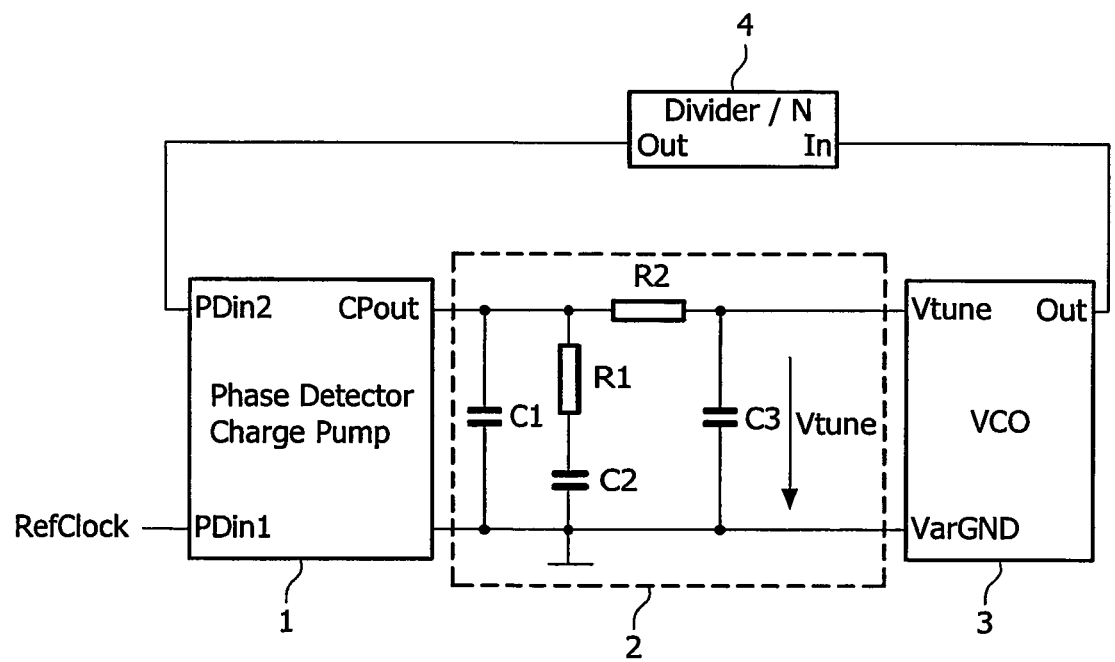

METHOD AND ARRANGEMENT FOR INTERFERENCE COMPENSATION IN A VOLTAGE-CONTROLLED FREQUENCY GENERATOR

The invention relates to a method and an arrangement for interference compensation in a voltage-controlled frequency generator, wherein the frequency generator is tuned to a nominal frequency via a tuning voltage $V_{tune}$ and whose actual frequency is compared with a reference frequency by means of a frequency comparison and is tuned if a deviation is discovered via the frequency comparison in which method in the event of interference the tuning voltage $V_{tune}$ is changed by an interference voltage $V_{stör}$ that depends on the interference event and thus a frequency deviating from the nominal frequency is generated, which deviating frequency is corrected again by the phase-locked loop.

In many transmission systems, which work for example on a wireless basis a desired carrier frequency is tuned to a desired value by means of a phase-locked loop (PLL). If it functions properly, a very stable carrier frequency is created by the phase-locked loop. This is used, in particular, for higher-order types of modulation, such as in WLAN systems with high transmission rates. In the case of a 64-QAM OFDM, the permissible static frequency deviation may be approx. 20 ppm, whereas it only takes a dynamic deviation of more than 0.5 ppm (2.5 kHz in the case of a 5 GHz carrier frequency) to bring about a reduction in performance.

Modem communication standards typically require high-speed switching between reception and transmission, which may lead to short-term instability in the frequency of the phase-locked loop during and/or after a switching operation.

In a state-of-the-art variant for compensation for interference of this nature, the phase-locked loop exhibits a frequency that deviates from the predetermined desired value following a switching event that generates interference, which event may be switching to another possible channel i.e. the phase-locked loop is disengaged. Following this switching event, the phase-locked loop adjusts the frequency of the voltage-controlled oscillator (VCO) until the nominal frequency value is reached; the phase-locked loop is thus re-engaged to the nominal frequency. The tuning voltage of the voltage-controlled oscillator $V_{tune}$ is then slightly different from the tuning voltage prior to the switching event or interference due to effects which lie outside the scope of this description.

Regardless of this special operation, each interference event causes a transient response in the phase-locked loop, i.e. it determines the voltage step that has to be added to the tuning voltage $V_{tune}$ to compensate fully for the frequency deviation caused by the interference and, thus, to cause the phase-locked loop back to build up to the nominal frequency.

A state-of-the-art phase-locked loop comprises, for example, a Phase Detector Charge Pump (PDCP) to which a reference clock pulse is fed. This module is connected to the Voltage-Controlled Oscillator (VCO) via a loop filter, possibly a third-order loop filter. An output of the voltage-controlled oscillator which outputs the oscillator frequency is connected via a frequency divider to a second input of the phase detector charge pump for the purpose of comparing the nominal and actual frequencies. If the output frequency of the voltage-controlled oscillator deviates from a predefined nominal value, the control voltage of the voltage-controlled oscillator $V_{tune}$ is re-adjusted by the phase detector charge pump until the nominal frequency is reached.

Consequently, the carrier frequency to be generated by the phase-locked loop deviates from the nominal frequency in the case of a known or unknown interference event. Known interference events are understood to mean state changes caused by the way in which the arrangement works, such as switching between a transmit and receive operation and vice versa, or a change of channel.

Consequently, the object of the invention is to create a method and an arrangement for interference compensation in a voltage-controlled frequency generator, thereby avoiding a deviation from a defined nominal frequency when known interference events occur.

The object is achieved in accordance with the invention with a method for interference compensation in a phase-locked loop comprising a voltage-controlled frequency generator of the type mentioned in the opening paragraph so that, if a known interference event occurs, a voltage $V_{comp}$ which compensates for the interference voltage $V_{stör}$ is generated in synchronism with this with sign inversion and is superimposed on the interference voltage $V_{stör}$.

A switching operation from one state to another in a transmit/receive arrangement, for example switching between transmission and reception, leads to a known interference event, and thus a change of the tuning voltage $V_{tune}$ which controls the voltage-controlled oscillator, by the amplitude value of the interference voltage $V_{stör}$. If both the time of a known interference event and the amplitude value of the interference-event-related interference voltage $V_{stör}$, are known, it is possible to eliminate the effect of the interference event on the tuning voltage $V_{tune}$, and thus on the actual frequency of the oscillator, by generating time-synchronous sign-inverted compensation voltage $V_{comp}$. One or more known interference events can be eliminated in this way.

In one embodiment of the invention there is provided that the relevant compensation voltage $V_{comp}$ is determined in one measuring operation for all possible known interference events, and this relevant voltage is stored in a compensation table.

In a further embodiment of the invention there is provided that the measuring operation and the storing of the voltage values in the compensation table is effected when the arrangement is made operative and/or during operation.

Since the interference voltage value $V_{stör}$ generated by an interference event must be known to facilitate the interference compensation in accordance with the invention, the interference voltage value must be measured for each possible interference event, and the measured value must be stored in a database, for example in tabular form in a compensation table as a compensation voltage value. For this purpose, a succession of interference events known one after the other are simulated in one measuring operation by means of state changes in the transmit/receive unit, and measurements are performed. When an arrangement is made operative for the first time, this operation can be started periodically, program-controlled or through state changes during operation. Following the generation of the compensation table, the values stored in the table are used by the method in accordance with the invention to compensate for the interference. The measurement can also be performed during the interference compensation in accordance with the method in order to monitor how the method works and, in the event of compensation not taking place properly, to correct the value assigned to the interference event.

In a special embodiment of the invention, the relevant compensation voltage value which is stored in the compensation table is read out before the occurrence of a known interference event generating interference voltage $V_{stör}$, and with this value the generation of the compensation voltage $V_{comp}$ is controlled in synchronism with the occurrence of the interference voltage.

Since the time at which a change in operating state occurs is known in the transmit/receive arrangement, the relevant value can be read from the compensation table in good time before the known interference event occurs and, with this value, the generation of the compensation voltage $V_{comp}$ can be controlled in synchronism with the interference event by means of a controllable voltage source, for example.

The object is achieved in accordance with the invention in the case of an arrangement for interference compensation in a phase-locked loop including a voltage-controlled frequency generator of the type mentioned in the opening paragraph in such a way that the VarGND terminal for the voltage-controlled frequency generator is connected to a controllable voltage source.

A compensation voltage $V_{comp}$, whose polarity is the reverse to that of the interference voltage $V_{stör}$, is applied to the VarGND terminal, which is connected to the GND potential in the state of the art. If both voltages have the same amplitude value, they cancel each other out and thus their effect on the voltage-controlled frequency generator.

In one embodiment of the invention, the controllable voltage source comprises a resistor located between the VarGND terminal and the GND potential and a current source connected between the VarGND terminal and the resistor.

In order to generate the compensation voltage $V_{comp}$ at the VarGND terminal of the voltage-controlled frequency generator, a current is driven through the resistor between the VarGND terminal and the GND potential by a controllable current source. The current causes a voltage drop to occur across the resistor. This voltage drop corresponds to the compensation voltage to be generated. The magnitude of the current generated by the controllable current source is determined by the compensation value which is read out from the compensation table beforehand.

In a further embodiment of the invention, the VarGND terminal on the voltage-controlled frequency generator is connected to a digital-to-analog converter which generates a compensation current, and the digital-to-analog converter is connected to two registers via a transmit/receive switch.

In this embodiment, the VarGND terminal is connected to a controllable current source whose current flows through the resistor which is located between the VarGND terminal and the GND potential, thereby causing a voltage drop to occur across this resistor, which corresponds to the compensation voltage. Depending on the operating state of the arrangement, the controllable current source which is designed as a digital-to-analog converter, is connected by a reversing switch either to a part of the register that governs transmission or to a part that governs reception, in which part the compensation values to be generated are stored.

In a special embodiment of the invention, the VarGND terminal is connected to the controllable voltage source via a voltage divider in such a way that the voltage divider is connected with a first partial resistor to the controllable voltage source, and the second series-connected partial resistor is connected to the GND potential and the VarGND terminal is connected with the connection of the first partial resistor to the second partial resistor.

A voltage source comprising a voltage divider with two resistors, to whose mid tap the VarGND terminal is connected, can be used to generate the compensation voltage $V_{comp}$ at the VarGND terminal of the controllable oscillator. Due to the dividing ratio of the voltage divider, the required compensation voltage $V_{comp}$ can be dimensioned accordingly. The voltage drop generated across the resistor between the VarGND terminal and GND corresponds to the compensation voltage $V_{comp}$. The voltage source is controlled by the value stored in the compensation table and thus generates a voltage value that corresponds to the interference event.

In an embodiment of the invention there is provided that a phase detector charge pump is arranged to which a reference clock pulse is fed via the first phase detector input (PDin1), wherein the output of the phase detector charge pump (Cpout) is connected to the input of a voltage-controlled frequency generator via a loop filter, that the output of the voltage-controlled frequency generator is connected to a second phase detector input (PDin2) via a frequency divider, that furthermore a measuring circuit is arranged, and that the loop filter comprises a first capacitor at the input, a third capacitor at the output, a second resistor arranged between the input and the output of the loop filter and a series circuit which is connected to the input and comprises a first resistor and a second capacitor, while the second capacitor in the series circuit is connected to the input of the measuring circuit, the input of the measuring circuit forming a virtual ground terminal. In order to measure the interference voltage $V_{stör}$ to be compensated for by the arrangement in accordance with the invention, a measuring device is configured in the arrangement, which device is connected to a terminal of the loop filter. The tuning voltage $V_{tune}$ is measured by this arrangement at different definable points in time. If, for example, a first measurement takes place before an interference event occurs and a second measurement is performed following the elapse of a defined time t, the voltage difference caused by the interference event can be measured, converted into a digital value and stored in the compensation table. The measuring circuit input forms a virtual ground terminal for the series circuit, which comprises a first resistor and a second capacitor, and leads to a slight deviation in potential from the real GND potential. However, this slight deviation has no functional influence on the functioning of the phase-locked loop.

In another embodiment of the invention, the measuring circuit comprises a negative-feedback inverting operational amplifier arrangement and an analog-to-digital converter unit.

Since the voltage differences only have a very small amplitude, they are amplified by an operational amplifier upstream of the analog-to-digital converter. Between the inverting input and its output, the operational amplifier has an outer circuit comprising two negative-feedback anti-parallel diodes, which limit the voltage output to the downstream analog-to-digital converter to the range from 0V to 1.5V.

In a particularly advantageous embodiment of the invention, there is provided that a measuring circuit is connected to the $V_{tune}$ input of the voltage-controlled frequency generator, that the measuring circuit comprises a first operational amplifier which works as a buffer amplifier whose output is connected via a first resistor and a capacitor to the inverting input of a second operational amplifier working as a negative-feedback inverting amplifier, that the non-inverting input of the second operational amplifier is connected to a reference voltage, that the output of the second operational amplifier is fed back to the inverting input via two anti-parallel diodes, that the output of the second operational amplifier is further connected via a second resistor to the connection of the first resistor and the capacitor, and that the output of the second operational amplifier has a TDet terminal for outputting a voltage.

Capacitors with higher capacitance values are problematic when incorporating the measuring circuit into an electric circuit. A solution is then, for example, to implement the capacitor as a non-desired, external component. For the arrangement in accordance with the invention it is sufficient to have a very small capacitor whose nominal value is approx. 1 pF. The operational amplifier OP-AMP, which is additionally required and whose non-inverting input is connected to the $V_{tune}$ terminal, works as a buffer amplifier. The second OP-AMP is operated as a negative-feedback inverting amplifier. The anti-parallel diodes in the negative feedback amplifier provide that the capacitor C is charged to such a voltage that the output signal TDet is limited to the range from 0 V to 1.5 V.

These and other aspects of the invention are apparent from and will be elucidated with reference to the embodiments described hereinafter.

Figure 2:
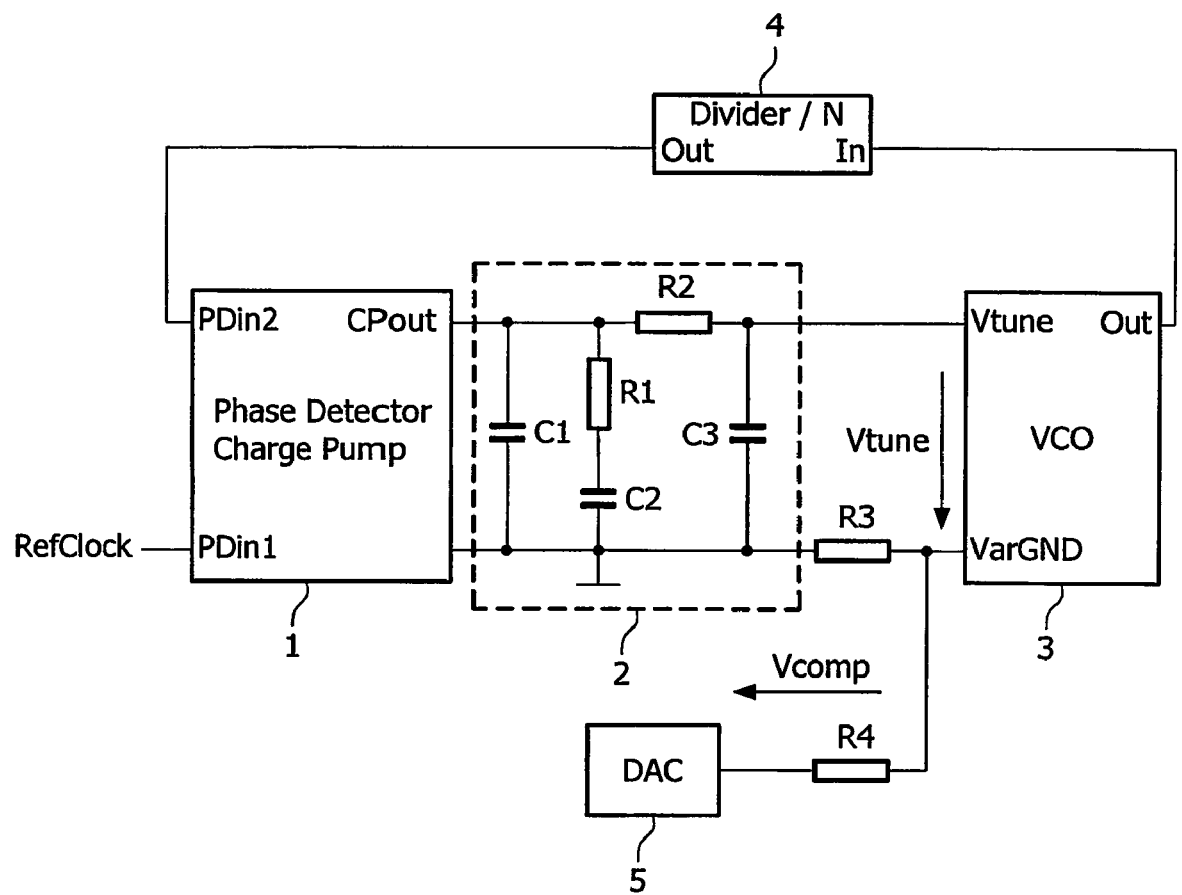
Figure 3:
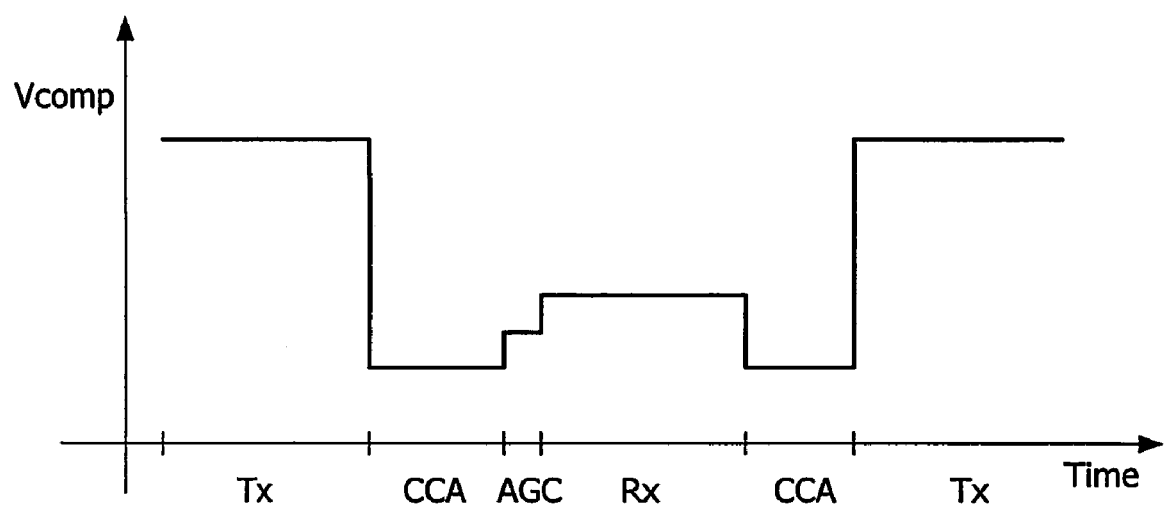
Figure 4:
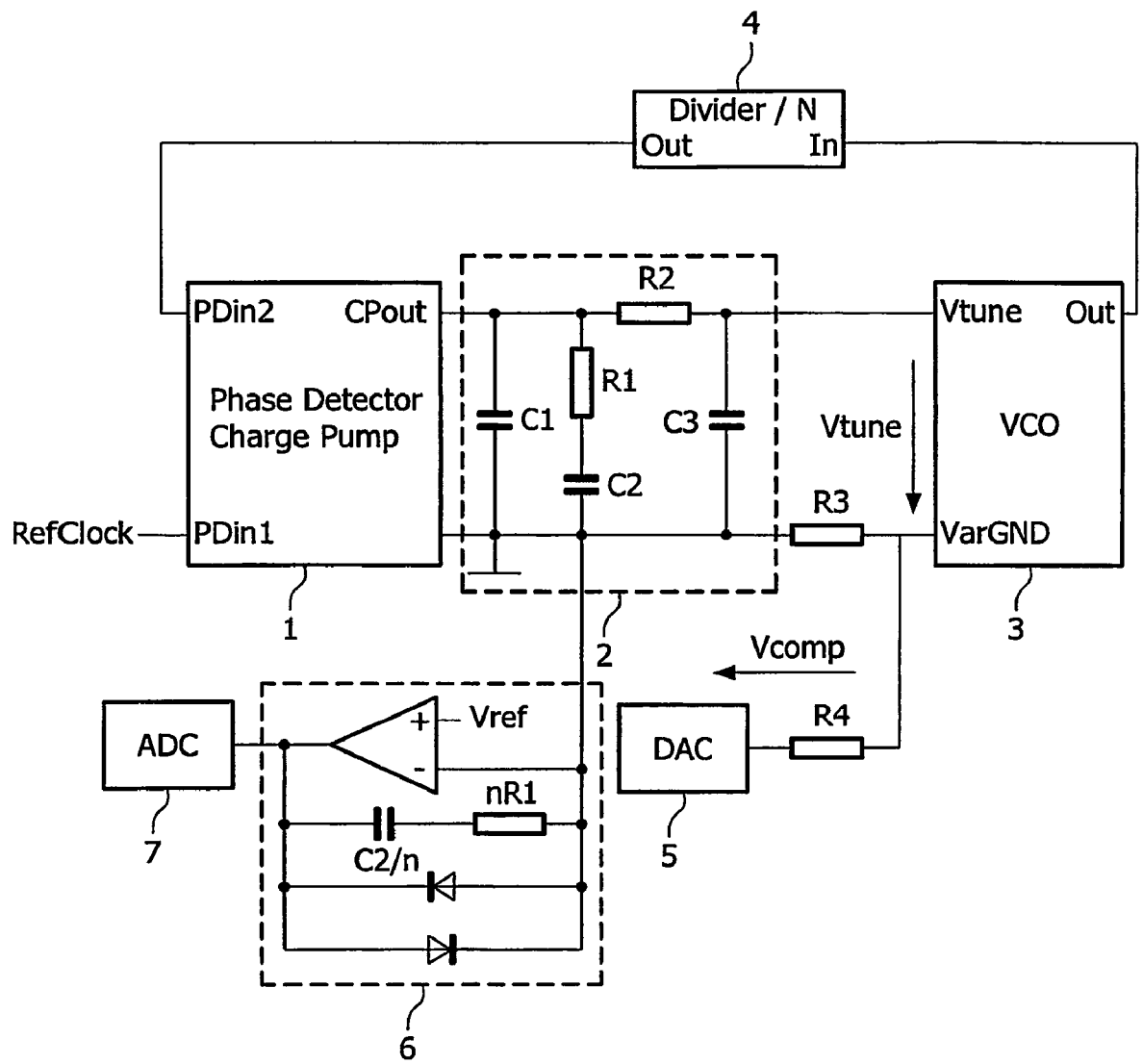
Figure 5:
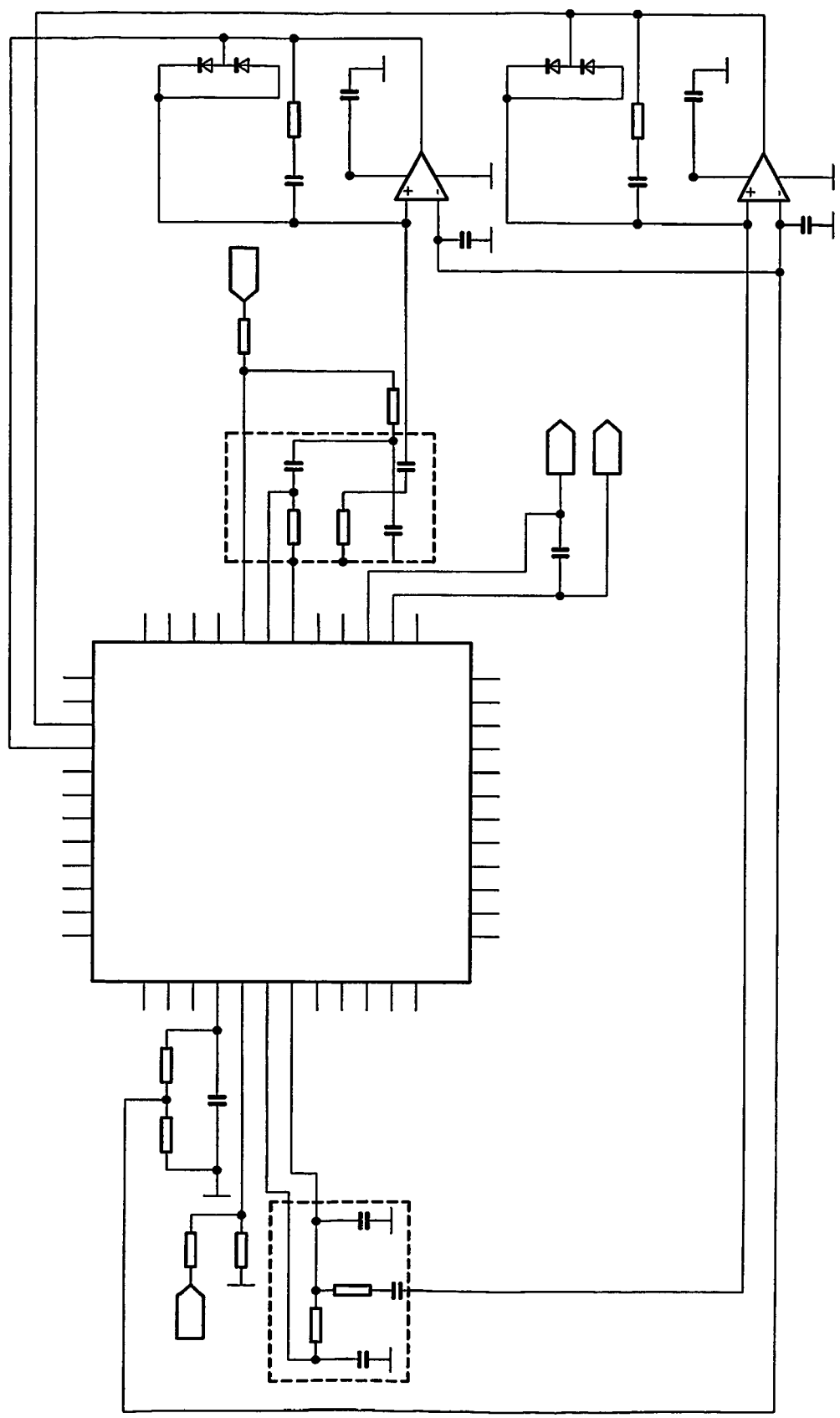
Figure 6:
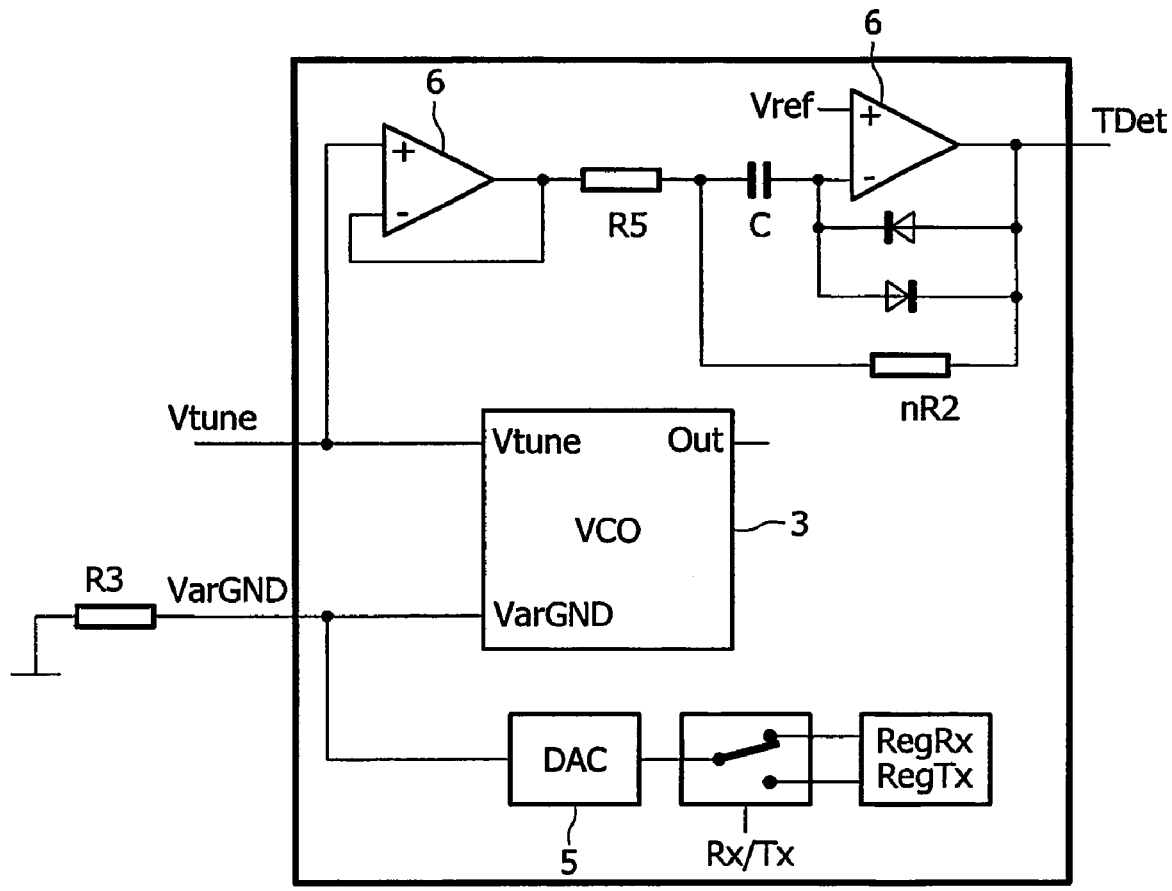

In the drawings:

FIG. 1 shows an arrangement of a phase-locked loop in accordance with the state of the art, FIG. 2 shows an arrangement of a phase-locked loop with the interference voltage compensation in accordance with the invention, FIG. 3 shows a typical flow chart of a transmitter/receiver unit, FIG. 4 shows an arrangement of a phase-locked loop with the interference voltage compensation in accordance with the invention and a measuring arrangement for determining the interference voltage $V_{stör}$, FIG. 5 shows a further arrangement for implementing the compensation and measuring method in accordance with the invention in a transmitter/receiver unit, and FIG. 6 shows a further embodiment for implementing the method according to the invention, which is suitable for integration in an electric circuit.

FIG. 1 shows an arrangement of a phase-locked loop as known from the state of the art. It comprises a phase detector charge pump 1 which is connected to a voltage-controlled oscillator (VCO) 3 via a third-order loop filter 2 comprising the elements R1, R2, C1, C2 and C3. In order to regulate the frequency produced by the oscillator 3 at the output Out, this frequency is fed back to the input PDin2 of the phase detector charge pump 1 via a frequency divider 4. An external reference frequency is applied to the second input PDin1 for the purposes of a frequency comparison. If an improper deviation is discovered in the result of the comparison between the actual frequency of the oscillator 3, which is divided by the frequency divider 4, and the reference frequency at the input PDin1, the tuning voltage $V_{tune}$ which regulates the oscillator frequency is changed until the nominal frequency value is achieved.

Normally a capacitor C3, which belongs to the loop filter 2, is connected in parallel to the input of the voltage-controlled oscillator 3, so that one end of the capacitor C3 is connected to the $V_{tune}$ input and the other end is connected to the VarGND terminal of the oscillator 3. The VarGND terminal is further connected to the central GND potential of the circuit.

In order to implement the method in accordance with the invention, the VarGND input of the oscillator 3 is, as shown in FIG. 2, connected to the GND potential in the circuit via a third resistor R3. The voltage drop generated via this resistor corresponds to the compensation voltage $V_{comp}$. Its amplitude can be controlled by a digital-to-analog converter 5 (DAC), which is connected to the input VarGND on the oscillator 3 and which generates a voltage or a current. In a voltage-controlled digital-to-analog converter 5, a fourth resistor R4 is inserted between the converter 5 and the input VarGND of the oscillator 3.

Since an interference event only has a slight influence on the amplitude of the tuning voltage $V_{tune}$, where the interference voltage is of the order of 0.1 mV to 10 mV, the required compensation voltage $V_{comp}$ is also small. One possible way of generating the compensation voltage $V_{comp}$ is to use a digital-to-analog converter 5. If this has an output voltage range of 0 to 1 V, for example, the compensation voltage $V_{comp}$ to be generated is generated by using a series circuit comprising the resistors R3 and R4 to divide the voltage. When using a digital-to-analog converter 5 as a power source, there is no need for the resistor R4 shown in the circuit arrangement in FIG. 2. For example, if a maximum output current from the digital-to-analog converter 5 is 1 mA, the resistor R3 is dimensioned with R3=10 Ohms.

The glitches, which are observed through the switching actions, for example when switching is effected between transmitting and receiving, run symmetrically with the time axis. If T(Z1,Z2) corresponds to the glitch that is generated when changing from state 1 to state 2, this means that T(Z1, Z2)=−T(Z2, Z1). If a compensation voltage $V_{comp}$, corresponding to the amplitude of the interference voltage $V_{stör}$ is supplied with sign inversion, the negative influence of the glitch on the tuning voltage $V_{tune}$ and thus on the actual frequency of the oscillator 3 disappears. The same principle may also be applied if several simultaneous or consecutive glitches occur. Interference compensation takes place here through the synchronous generation of a compensation voltage $V_{comp}$ associated with the interference. For this purpose, FIG. 3 shows a typical process in a transmitter/receiver unit, in which the system is switched from a transmission state "Tx" to "CCA" state with a defined high reception gain. The AGC operation subsequently starts, followed by the actual reception operation "Rx". After the reception operation "Rx", there is a renewed "CCA" state, followed by a transmission state "Tx" again for the transmission of a further data packet. Interference always occurs during transition from one operating state to a next, which interference is compensated for by the method in accordance with the invention, through the generation of a compensation voltage $V_{comp}$ associated with the interference.

In order to generate a compensation voltage $V_{comp}$ which relates to an interference event, the relevant interference voltage $V_{stör}$ has to be determined. This necessitates a method and an arrangement for measuring the interference voltage $V_{stör}$ in the definitive system. A possible embodiment is shown in FIG. 4. This measuring method should preferably not disrupt the normal function because, for example, drifting operating parameters due to temperature changes or other influences must be tracked. As interference events which occur are typically compensated for by the phase-locked loop following elapse of its control time, the difference in the tuning voltage $V_{tune}$ can be used both before and after the control time of the phase-locked loop as a measure or as an error criterion for the compensation values. There should ideally be no change observed in the tuning voltage $V_{tune}$ during transition from one state to another if compensation has taken place properly. The difference in $V_{tune}$ values measured before the interference event and after the transient response by the phase-locked loop is in proportion to the interference voltage which occurs if the constants for each measurement remain unchanged.

Since the compensation voltage $V_{comp}$ is smaller than the tuning voltage $V_{tune}$, only the change in voltage should be measured. As the changes in $V_{tune}$ are small in any event, adequate amplification is required. A suitable measuring circuit is shown in FIG. 4 where C2 is connected to a virtual ground terminal, which is generated by an inverting operational amplifier 6.

The operational amplifier 6 should be a CMOS rail-to-rail type which can work up to the operating voltage limit for inputs and outputs and has small input currents. The voltage gain is n for AC voltage signals, for example n=100. A floating DC voltage cap is limited by the anti-parallel diodes. A reasonable reference voltage is $V_{ref}=0.75$ V, which yields an input voltage for the analog-to-digital converter arrangement (ADC) of the order of about 0 to 1.5 V.

The compensation voltage $V_{comp}$ is measured by calculating the difference between 2 ADC samples of the analog-to-digital converter unit 7, while the first sample is determined close to the time of the interference event, and the second sample is determined following a transient response by the phase-locked loop, which is identified by the loop filter 2. This difference is proportional to the voltage difference at C1, which is close to the difference of $V_{tune}$ if the low-pass filter, which is formed by R2 and C3, has an essentially higher critical frequency than the main loop filter.

The OP-AMP 6 is operated as a negative-feedback, inverting amplifier 6, such as the type described in the book "*Analoge integrierte Schaltungen*" by Miklos Herpy (Franzis Verlag 1979, ISBN 3-7723-6152-8). The impedance of the RC element in the negative feedback of the OP-AMP is $Z2=nR1+n/(j\omega C2)$, and that before the inverting input is $$Z1=R1+1/(j\omega C2).$$

Therefore, the AC voltage gain is approximately $$v=-Z2/Z1=-n$$

and is frequency-independent in particular. The behavior of the loop filter 2 in the phase-locked loop remains largely unaffected by this detection circuit, because the negative feedback serves to ensure that the prevailing voltage at the inverting input of the OP-AMP 6 is virtually identical with the voltage at the non-inverting input, i.e. $V_{ref}=0.75$ V. This DC voltage, which is additional to the original filter in FIG. 2, is blocked by the capacitor C2 and does not change the dynamic behavior.

FIG. 5 shows a further variant of an arrangement in accordance with the invention for implementing the method in a TD-2 RF structure. As TD-2 RF is based on superheterodyne architecture, always two phase-locked loops (IF und RF) are included in the transmission (Tx) and reception operation (Rx). For example, the circuit shown in FIG. 4 is configured twice in FIG. 5. TD-2 BB has 2 Sigma/Selta DACs which are used to compensate for the interference voltages. The TD2 BB further supports an ADC for RSSI measurements, which ADC is connected to TD-2 RF, while an analog multiplexer has two inputs which can be switched to the ADC via a simple differential converter.

The loop filter 2 is designed in such a way that a complete transient response is achieved of the phase-locked loop within approx. 200 μs. Apart from the known interference events, changes can also be observed in the tuning voltage caused for example by a temperature drift, which changes also bring about changes to the tuning voltage $V_{tune}$, without the phase-locked loop being broken. In order to distinguish between short and long-term effects, the ADC sample is generated about 100 μs after the change of state.

It is advantageous to integrate an interference compensation and measurement circuit arrangement on future RF chips which contain a phase-locked loop for which chips strict requirements are made on the criteria for frequency stability. The additional circuit is simple and requires not more energy.

An internal current mode DAC, which is connected to the VarGND terminal, can be used for compensation, as FIG. 6 shows. This current mode DAC works as a controllable current source. An external resistor R3 opposite the GND potential determines the effective compensation voltage. Based on experience with the TD-2 RF, a 9-bit monotonous DAC with a 0.5 mA maximum output current to a 10 ohm external resistor should be used.

The circuit shown in FIG. 4 generally requires capacitors which are too large for integration. However, it is sufficient for the circuit shown in FIG. 6 to have a capacitor C of the order of 1 pF and it is therefore more suitable for integration, although it requires a further operational amplifier OP-AMP 6 as a buffer amplifier. The latter is connected directly to the tuning voltage $V_{tune}$, so that no additional IC pins are used other than those used in the conventional, uncompensated circuit. The second OP-AMP 6 is used as a negative-feedback, inverting amplifier with AC voltage gain of $v=-nR5/R5=-n$.

The anti-parallel diodes in the negative feedback mode provide that the capacitor C is charged to such a voltage that the output signal TDet is limited to the range from 0 to 1.5 V.

LIST OF REFERENCES

1 Phase detector charge pump
2 Loop filter
3 Voltage-controlled frequency generator
4 Frequency divider
5 Digital-to-analog converter
6 Operational amplifier arrangement
7 Analog-to-digital converter unit

The invention claimed is:

1. An arrangement for interference compensation in a phase-locked loop comprising:
   a voltage-controlled frequency generator, having a $V_{tune}$ input and a VarGND terminal, wherein the VarGND terminal is connected to a controllable voltage source comprising:
   a resistor connected between the VarGND terminal and a GND potential of a loop filter of said phase-locked loop; and
   a controllable current source connected between the VarGND terminal and the resistor,
   wherein the controllable current source is external to the phase-locked loop.

2. An arrangement as claimed in claim 1, wherein the VarGND terminal is connected to a digital-to-analog converter which generates a compensation current, and in that the digital-to-analog converter is connected to two registers via a transmit/receive change-over switch.

3. An arrangement as claimed in claim 1, wherein the VarGND terminal is connected to the controllable voltage source via a voltage divider, wherein the voltage divider is connected via a first partial resistor to the controllable voltage source, and a second partial resistor, which is connected in series, is connected to the GND potential and the VarGND terminal with the connection to the first partial resistor is connected to the second partial resistor.

4. An arrangement as claimed in claim 1, a phase detector charge pump is arranged to which a reference clock is applied via a first phase detector input (PDin1), wherein the output of the phase detector charge pump (Cpout) is connected to the input of a voltage-controlled frequency generator via a loop filter, wherein the output of the voltage-controlled frequency generator is connected to a second phase detector input (PDin2) via a frequency divider, wherein the loop filter comprises a first capacitor at the input end, a third capacitor at the output end, a second resistor arranged between the input and the output of the loop filter and a series circuit which is connected to the input and comprises a first resistor and a second capacitor, wherein the second capacitor of the series circuit is connected to the input of the measuring circuit, while the input in the measuring circuit forms a virtual ground terminal.

5. An arrangement as claimed in claim 4, further comprising:
   a measuring circuit comprising a negative-feedback inverting operational amplifier arrangement and an analog-to-digital converter unit.

6. An arrangement as claimed in claim 1, further comprising:
   a measuring circuit connected to the $V_{tune}$ input of the voltage-controlled frequency generator, the measuring circuit comprises:
   a first operational amplifier which works as a buffer amplifier whose output is connected via a first resistor and a capacitor to an inverting input of a second operational amplifier, working as a negative-feedback inverting amplifier, and a non-inverting input of the second operational amplifier connected to a reference voltage, wherein the output of the second operational amplifier is fed back to the inverting input via two anti-parallel diodes, and the output of the second operational amplifier is further connected via a second resistor to the connection of the first resistor and the capacitor, and the output of the second operational amplifier has a TDet terminal for outputting a voltage.

* * * * *